United States Patent
Xu et al.

(10) Patent No.: US 10,586,638 B2
(45) Date of Patent: Mar. 10, 2020

(54) QUENCH PROTECTION APPARATUS FOR SUPERCONDUCTING MAGNET SYSTEM

(71) Applicant: General Electric Company, Schenectady, NY (US)

(72) Inventors: Minfeng Xu, Ballston Lake, NY (US); Evangelos Laskaris, Schenectady, NY (US); Weijun Shen, Florence, SC (US); Jianshe Wang, Florence, SC (US); Anbo Wu, Clifton Park, NY (US); Ye Bai, Niskayuna, NY (US); Yunxing Song, ShangHai (CN)

(73) Assignee: General Electric Company, Schenectady, NY (US)

( * ) Notice: Subject to any disclaimer, the term of this patent is extended or adjusted under 35 U.S.C. 154(b) by 310 days.

(21) Appl. No.: 15/519,773

(22) PCT Filed: Oct. 9, 2015

(86) PCT No.: PCT/US2015/054945
§ 371 (c)(1),
(2) Date: Apr. 17, 2017

(87) PCT Pub. No.: WO2016/060957
PCT Pub. Date: Apr. 21, 2016

(65) Prior Publication Data
US 2017/0250018 A1 Aug. 31, 2017

(30) Foreign Application Priority Data
Oct. 17, 2014 (CN) .......................... 2014 1 0554507

(51) Int. Cl.
*H01F 6/02* (2006.01)
*G01R 33/3815* (2006.01)
(Continued)

(52) U.S. Cl.
CPC ........... *H01F 6/02* (2013.01); *G01R 33/3815* (2013.01); *H01F 6/04* (2013.01); *H01F 6/06* (2013.01)

(58) Field of Classification Search
CPC ..... H01F 6/02; H01F 6/04; H01F 6/06; H02F 6/06; G01R 33/3815
(Continued)

(56) References Cited

U.S. PATENT DOCUMENTS 6,147,844 A * 11/2000 Huang ............... G01R 33/3815
361/141
6,147,944 A * 11/2000 Kwon .................. G11B 7/0941
369/44.29
(Continued)

FOREIGN PATENT DOCUMENTS

| JP | 4319602 B2 | 8/2009 |
|---|---|---|
| JP | 4699293 B2 | 6/2011 |
| JP | 5150241 B2 | 2/2013 |

OTHER PUBLICATIONS

Extended European Search Report and Opinion issued in connection with corresponding EP Application No. 15851065.1 dated May 24, 2018, 10 pages.
(Continued)

*Primary Examiner* — Dharti H Patel

(57) ABSTRACT

A quench protection apparatus includes a number N of superconducting coils and a heater matrix. The number N of superconducting coils are electrically coupled in series. The heater matrix module includes the number N of heater units. The number N of heater units is electrically coupled in parallel with the number N of superconducting coils respectively. A number M of the heater units each includes at least the number N of heaters. Each superconducting coil is thermally coupled with at least one heater of each of the number M of the heater units. The number of N-M of the
(Continued)

heater units each includes at least one heater. Each of the number M of superconducting coils correspondingly coupled with the number M of the heater units is thermally coupled with at least one heater of each of the number N-M of the heater units. A superconducting magnet system protected by above quench protection apparatus is also provided.

11 Claims, 8 Drawing Sheets

(51) Int. Cl.
    *H01F 6/04*         (2006.01)
    *H01F 6/06*         (2006.01)
(58) Field of Classification Search
    USPC .......................................................... 361/19
    See application file for complete search history.

(56) References Cited

U.S. PATENT DOCUMENTS

| | | | | |
|---|---|---|---|---|
| 6,307,370 B1* | 10/2001 | Schauwecker | ....... | G01R 33/421 324/309 |
| 6,563,316 B2* | 5/2003 | Schauwecker | ....... | G01R 33/421 324/318 |
| 6,960,914 B2* | 11/2005 | Shen | ............ | G01R 33/389 324/318 |
| 7,477,055 B1* | 1/2009 | Huang | ............ | G01R 33/3815 324/318 |
| 7,615,998 B2* | 11/2009 | Huang | ............ | G01R 33/288 324/319 |
| 8,482,369 B2* | 7/2013 | Wang | ............ | H01F 6/02 335/216 |
| 2004/0027737 A1* | 2/2004 | Xu | ............ | H01F 6/02 361/19 |
| 2006/0227471 A1* | 10/2006 | Tsuchiya | ............ | H02H 7/001 361/19 |
| 2006/0291112 A1* | 12/2006 | Markiewicz | ............ | H01F 6/02 361/19 |
| 2010/0283565 A1 | 11/2010 | Blakes | | |
| 2011/0069418 A1* | 3/2011 | Huang | ............ | G01R 33/288 361/19 |
| 2012/0182012 A1* | 7/2012 | Lvovsky | ............ | G01R 33/3815 324/318 |
| 2013/0029849 A1* | 1/2013 | Wu | ............ | G01R 33/3815 505/211 |
| 2014/0185165 A1* | 7/2014 | Rajput-Ghoshal | ..... | H02H 7/001 361/19 |

OTHER PUBLICATIONS

International Search Report and Written Opinion for International Application No. PCT/US2015/054945, dated Apr. 20, 2016, 16 pages.

* cited by examiner

QUENCH PROTECTION APPARATUS FOR SUPERCONDUCTING MAGNET SYSTEM

CROSS-REFERENCE TO RELATED APPLICATIONS

This is a national stage application under 35 U.S.C. § 371 (c) of PCT Patent Application No. PCT/US2015/054945, filed on Oct. 9, 2015, which claims priority to China Patent Application No. 201410554507.1, filed on Oct. 17, 2014, the disclosures of which are incorporated herein by reference in their entireties.

BACKGROUND

Embodiments of the invention relate generally to superconducting magnet systems, and in particular, to a quench protection apparatus which protects superconducting coil assemblage from damage during a quench.

Superconducting magnet systems having relatively large energies are currently used in many applications. For example, superconducting magnet systems, storing energy of up to tens of mega Joules, are constructed for Magnetic Resonance Imaging (MRI) systems which are now being routinely used in large numbers in clinical environments for medical imaging. A part of such a MRI system is a superconducting magnet system for generating a uniform magnetic field.

Superconducting magnets tend to be inherently unstable in that the temperature of a coil region of the magnet can rise relatively rapidly, due to a disturbance within the magnet itself or due to a cause external to the magnet. Such a temperature rise causes a quenching of that coil region, i.e., the superconducting coil goes from its superconducting state of essentially zero resistance to a resistive state. When such coil region gets hot very rapidly the stored energy within the magnet tends to become dissipated rapidly into that finite resistive region and may severely damage the magnet, even in some cases causing an actual melting of the superconducting wires in the coil region.

Accordingly, it is necessary to provide a quench protection apparatus for protecting the superconducting coil assemblage. In general, the quench protection apparatus is designed such that the "quench" is propagated as quickly as possible after initiation, that is, if some area of a coil region quenches, the superconducting magnet system is designed so that the entire superconducting coils become resistive as soon as possible. This design criteria results in lower voltages and lower peak temperatures in superconducting magnet compared to un-protected magnet quench since the stored energy of the superconducting magnet system is dispersed throughout a larger mass.

Known quench protection techniques include using a quench-detection signal (from the electrical center of the superconducting coil assemblage of the superconducting magnet system) directly supplying an energy dump resistor or directly powering wide-area heaters located on the superconducting coil assemblage.

For these and other reasons, there is a need for providing a new quench protection apparatus to protect the superconducting coil assemblage from damage during a quench.

BRIEF DESCRIPTION

In accordance with an embodiment of the invention, a quench protection apparatus is provided. The quench protection apparatus includes a number N of superconducting coils and a heater matrix. The number N of superconducting coils are electrically coupled in series. The heater matrix module includes the number N of heater units. The number N of heater units is electrically coupled in parallel with the number N of superconducting coils respectively. A number M of the heater units each includes at least the number N of heaters. Each superconducting coil is thermally coupled with at least one heater of each of the number M of the heater units. The number of N-M of the heater units each includes at least one heater. Each of the number M of superconducting coils correspondingly coupled with the number M of the heater units is thermally coupled with at least one heater of each of the number N-M of the heater units.

In accordance with another embodiment of the invention, a superconducting magnet system is provided. The superconducting magnet system includes a vacuum vessel, a thermal shield, a cooling apparatus, a number N of superconducting coils and a heater matrix module. The vacuum vessel is for forming a central magnetic field area and sustaining a vacuum environment for the superconducting magnet. The thermal shield is arranged concentrically within the vacuum vessel. The cooling apparatus is arranged within the thermal shield. The number N of superconducting coils are electrically coupled in series. The heater matrix module includes the number N of heater units. The number N of heater units is electrically coupled in parallel with the number N of superconducting coils respectively. A number M of the heater units each includes at least the number N of heaters. Each superconducting coil is thermally coupled with at least one heater of each of the number M of the heater units. The number of N-M of the heater units each includes at least one heater. Each of the number M of superconducting coils correspondingly coupled with the number M of the heater units is thermally coupled with at least one heater of each of the number N-M of the heater units.

In accordance with another embodiment of the invention, a quench protection apparatus is provided. The quench protection apparatus includes a number N of superconducting coils and the number N of heaters. The number N of heaters is electrically coupled with each superconducting coil, and each superconducting coil being thermally coupled with one of the heaters electrically coupled with each superconducting coil.

DRAWINGS

These and other features and aspects of embodiments of the present invention will become better understood when the following detailed description is read with reference to the accompanying drawings in which like characters represent like parts throughout the drawings, wherein:

FIG. 9 is a circuit schematic diagram related to a heater matrix module electrically coupled with multiple superconducting coils of a quench protection apparatus of the superconducting magnet system according to one embodiment;

FIG. 10 is a circuit schematic diagram related to a heater matrix module thermally coupled with multiple superconducting coils of a quench protection apparatus of FIG. 9 according to one embodiment;

FIG. 11 is a schematic cross-sectional view taken along a vertical center plane of a superconducting magnet system according to yet another embodiment;

FIG. 12 is a circuit schematic diagram related to a heater matrix module electrically coupled with multiple superconducting coils of a quench protection apparatus of the superconducting magnet system of FIG. 11 according to one embodiment;

FIG. 13 is a circuit schematic diagram related to the heater matrix module electrically coupled with the multiple superconducting coils of the quench protection apparatus of the superconducting magnet system of FIG. 11 according to another embodiment;

FIG. 14 is a schematic view related to the heater matrix module thermally mounted on the multiple superconducting coils of the quench protection apparatus of the superconducting magnet system of FIG. 12 or FIG. 13 according to one embodiment;

FIG. 15 is a schematic cross-sectional view taken along a vertical center plane of the superconducting magnet system according to another embodiment;

FIG. 16 is a schematic cross-sectional view taken along a line 5-5 of the superconducting magnet system of FIG. 15 according to one embodiment;

FIG. 17 is a schematic cross-sectional view taken along a vertical center plane of the superconducting magnet system according to another embodiment; and FIG. 18 is a schematic cross-sectional view taken along a line 7-7 of the superconducting magnet system of FIG. 17 according to one embodiment.

DETAILED DESCRIPTION

Unless defined otherwise, technical and scientific terms used herein have the same meaning as is commonly understood by one of those ordinarily skilled in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items, and terms such as "front", "back", "bottom", and/or "top", unless otherwise noted, are merely used for convenience of description, and are not limited to any one position or spatial orientation. Moreover, the terms "coupled" and "connected" are not intended to distinguish between a direct or indirect coupling/connection between two components. Rather, such components may be directly or indirectly coupled/connected unless otherwise indicated.

Unless indicated to the contrary, the numerical parameters set forth in the following specification and attached claims are relative ranges that may vary depending upon the desired properties sought to be obtained by the present invention. At the very least each numerical parameter should at least be construed in light of the number of reported significant digits and by applying ordinary rounding techniques.

Figure 1:
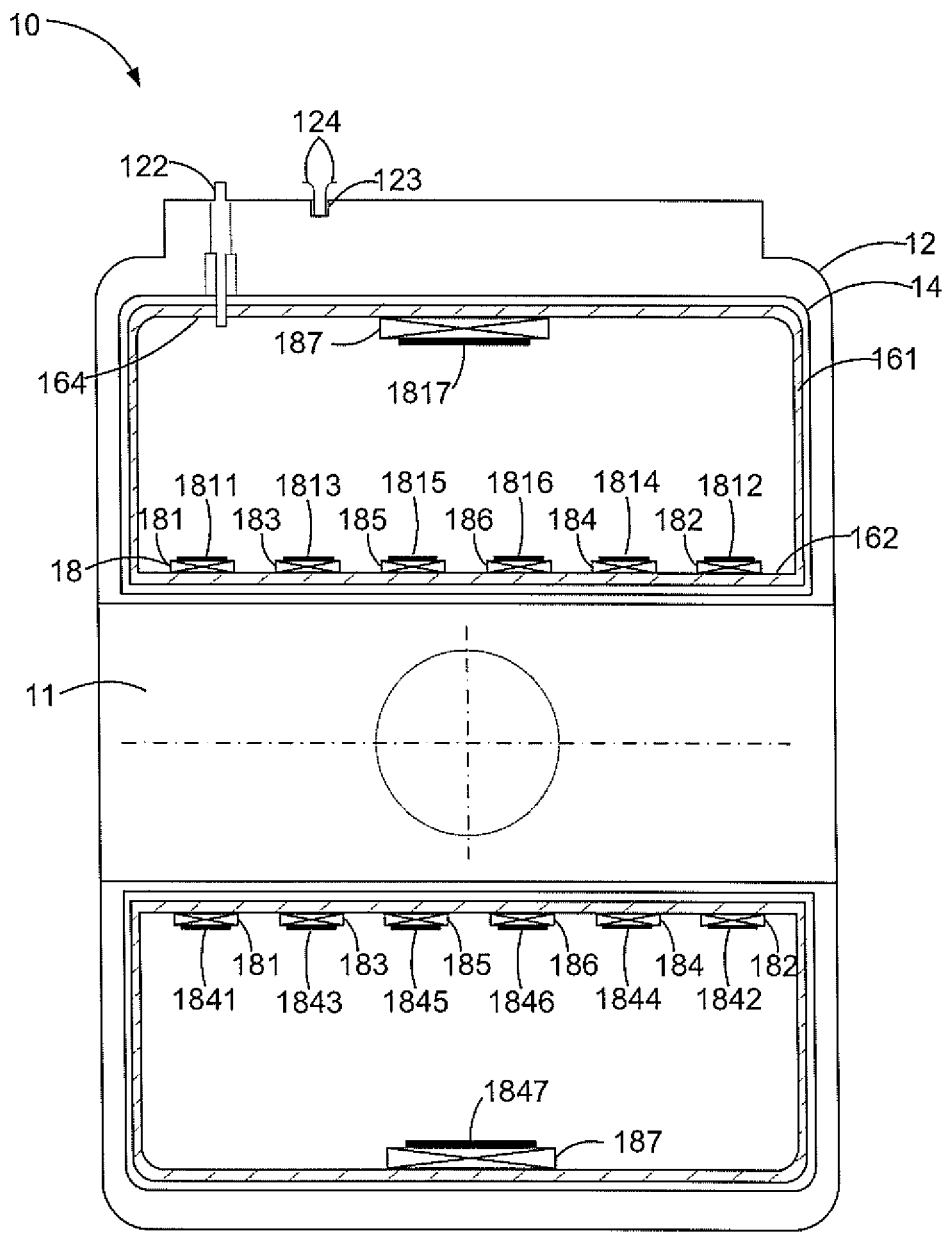
FIG. 1 is a schematic cross-sectional view taken along a vertical center plane of a superconducting magnet system according to one embodiment.

Referring to FIG. 1, a schematic cross-sectional view taken along a vertical center plane of a superconducting magnet system 10 according to one embodiment is shown. As an example, the superconducting magnet system 10 includes a donut-shaped vacuum vessel 12 forming a central magnetic field area 11, a donut-shaped thermal shield 14 concentrically within the vacuum vessel 12, and a cooling apparatus concentrically within the thermal shield 14. In this embodiment, a donut-shaped cryogen vessel 161 arranged concentrically within the thermal shield 14 is used as the cooling apparatus. The cooling apparatus is used for cooling and maintaining the superconducting magnet system 10 to an extremely low temperature.

In the illustrated embodiment of FIG. 1, the superconducting magnet system 10 includes a number N (N is an integer) of superconducting coils 18. The number N of superconducting coils 18 include multiple main superconducting coils 181, 182, 183, 184, 185, 186 and a shielding/bucking superconducting coil 187. The main superconducting coils 181-186 are wounded on or attached to a center inner surface 162 of the cryogen vessel 161. The shielding/bucking superconducting coil 187 is wounded on or attached to a periphery inner surface 164 of the cryogen vessel 161. Namely the center inner surface 162 and the periphery inner surface 164 act as a coil support structure to support the number N of superconducting coils 18. The superconducting coils 181-187 as shown in FIG. 1 are cooled by the cryogen, for example liquid helium, contained in the cryogen vessel. In other embodiments, the number N of superconducting coils 18 may be installed on other kinds of coil support structures such as metal formers, metal bars, fiberglass reinforced plastic (FRP) former, or FRP bars, which are not described here.

In the illustrated embodiment of FIG. 1, the vacuum vessel 12 may include a refrigerator 122 communicating with the thermal shield 14 and the cryogen vessel 161 to refrigerate the number N of superconducting coils 18. For example, the cryogen vessel 161 is refrigerated down to about 4.2 kelvins (K). The space between the cryogen vessel 161 and the thermal shield 14 is refrigerated down to about 40-50K. The vacuum vessel 12 also includes a service port 123 providing communicating ports having multiple power leads 124 used to electrically couple external power to the superconducting coils 18 and other electrical parts. In other embodiments, the cryogen vessel 161 used for cooling of the number N of superconducting coils 18 can be removed, instead some thermo-siphon cooling pipes 163 (as shown in FIG. 15) or other kinds of direct-conduction refrigerating means may be used as the cooling apparatus to refrigerate the number N of superconducting coils 18 to an operating cryogenic temperature.

In some specific embodiments, the superconducting magnet system 10 is a low temperature superconducting magnet system consisting of superconducting coils with low temperature superconductors. In another embodiment, the superconducting magnet system 10 also can be other types of superconducting magnet systems. The superconducting magnet system 10 can be used in many suitable fields, such as used in a magnetic resonance imaging (MRI) system and so on.

As an example, in the illustrated embodiment of FIG. 1, the main superconducting coils 181-186 includes six superconducting coils which have two large superconducting coils 181 and 182, two medium superconducting coils 183 and 184, and two small superconducting coils 185 and 186. The large superconducting coils 181 and 182 are arranged at the two axially outer sides of the center inner surface 162, the small superconducting coils 185 and 186 are arranged at the center of the center inner surface 162, and the medium superconducting coils 183 and 184 are arranged axially between the other two superconducting coils as shown in FIG. 1. In some embodiments, the width of the small superconducting coils 185 and 186 are the smallest, the width of the large superconducting coils 181 and 182 are the largest, and the width of the medium superconducting coils 183 and 184 are between the other two superconducting coils. In other embodiments, the number, the width, and the location arrangement of those main superconducting coils 181-186 can be adjusted according to different design requirements.

In this illustrated embodiment of FIG. 1, the number of the bucking superconducting coil 187 is only one. In other embodiments, the number of the bucking superconducting coils 187 may be two or more. The bucking superconducting coil 187 is configured to generate a magnetic shield to prevent the magnet field created by the main superconducting coils 181-186 from going beyond a designated footprint area.

Figure 2:
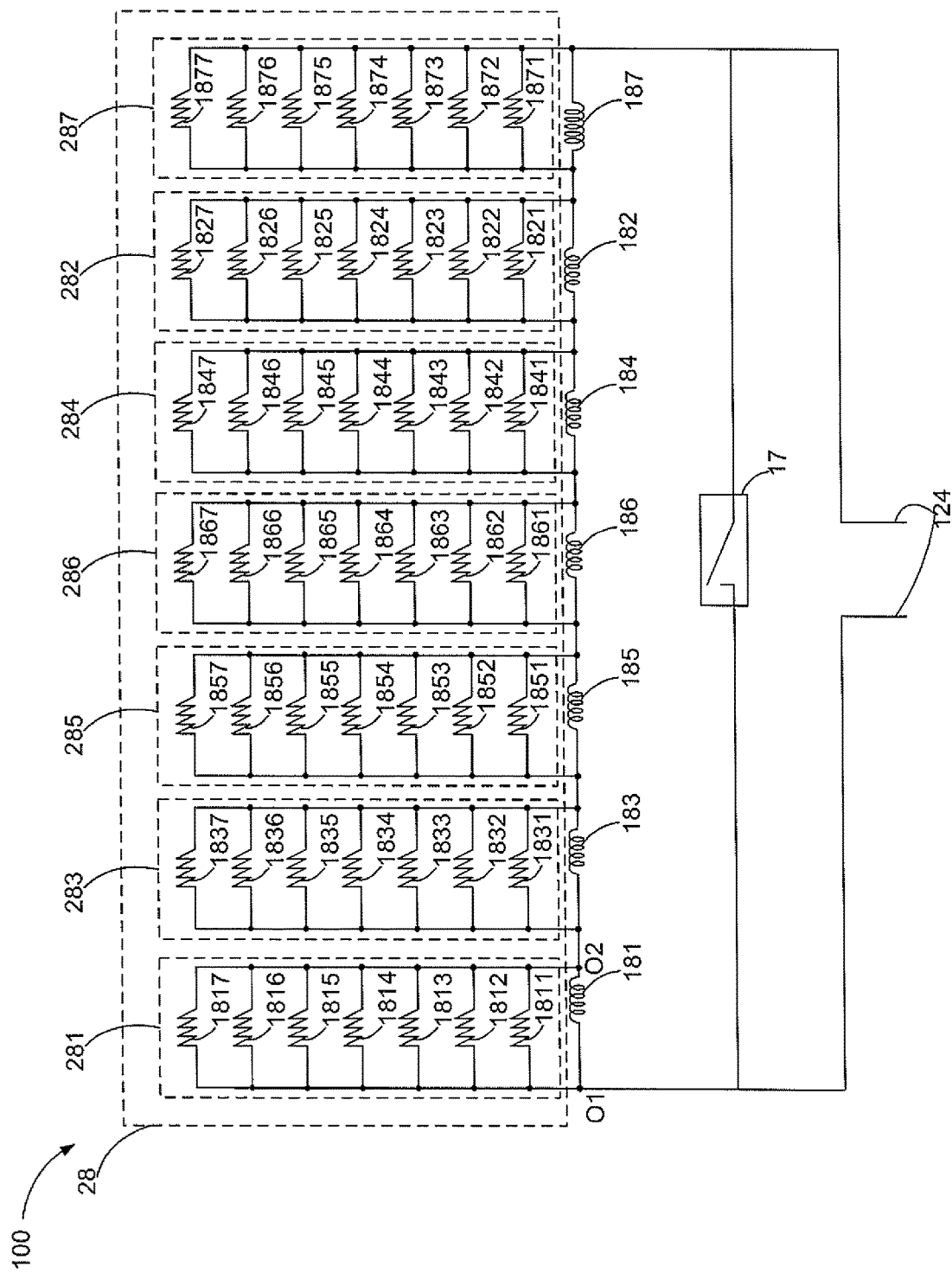
FIG. 2 is a circuit schematic diagram related to a heater matrix module electrically coupled with multiple superconducting coils of a quench protection apparatus of the superconducting magnet system of FIG. 1 according to one embodiment.

In other embodiments, the magnetic shield also can be generated by other types of configurations without using the bucking superconducting coil 187. For example, the vacuum vessel 12 can be designed as a magnetic shield. In non-limited embodiments, the vacuum vessel 12 may employ iron shields (iron yokes) for shielding the magnet field 11 for example. In other embodiments, the magnetic shield also can be generated by both bucking superconducting coils 187 and the iron shields In the illustrated embodiment of FIG. 1, the superconducting magnet system 10 includes a heater matrix module 28 as shown in FIG. 2. The heater matrix module 28 is electrically coupled and thermally coupled with the number N of superconducting coils 18, which will be described in detail with FIG. 2. The heater matrix module 28 is used to heat the number N of superconducting coils 18 during a quench.

Referring to FIG. 2, a circuit schematic diagram related to the heater matrix module 28 electrically coupled with the number N of superconducting coils 18 of a quench protection apparatus 100 of the superconducting magnet system 10 of FIG. 1 according to one embodiment is shown. The quench protection apparatus 100 includes the main superconducting coils 181-186, the bucking superconducting coil 187, the heater matrix module 28, a main superconducting switch 17, and the power leads 124.

In the quench protection apparatus 100, the main superconducting coils 181-186 and the bucking superconducting coil 187 are electrically coupled in series and then coupled between the power leads 124. The bucking superconducting coil 187 carries current in an opposite direction to the main superconducting coils 181-186. The main superconducting switch 17 is electrically coupled between the power leads 124 as well. During a magnet ramp-up process, an external power source (not shown) provides power to the number N of superconducting coils 181-187 through the power leads 124. Once the number N of superconducting coils 181-187 are energized to pre-determined current and magnetic field, the main superconducting switch 17 is closed to establish a closed superconducting loop with the number N of superconducting coils 18. Therefore, a magnet field is generated in the magnet field area 11 by the main superconducting coils 181-186, and a magnetic shield is also generated by the bucking superconducting coil 187. It is understood that other conventional additional circuit elements may be further applied in the quench protection apparatus 100 which are not described and shown here for simplicity of illustration.

In this illustrated embodiment, the heater matrix module 28 includes the number N of heater units (e.g., heater units 281, 282, 283, 284, 285, 286, and 287). The number N of heater units 281-287 are electrically coupled in parallel with the number N of superconducting coils 181-187 respectively (e.g., the heater unit 287 is electrically coupled with two terminals of the bucking superconducting coil 187 at points A and B).

A number M ($1 \leq M \leq N$) of the heater units each includes at least the number N of heaters. Each superconducting coil is thermally coupled with at least one heater of each of the number M of the heater units. A number of N-M of the heater units each includes at least one heater. Each of the number M of superconducting coils which is coupled with the number M of the heater units is thermally coupled with at least one heater of each of the number N-M of the heater units.

In the embodiment of FIG. 1, M is equal to 1. As shown in this embodiment, the heater unit 287 which is electrically coupled with the bucking superconducting coil 187 includes N heaters 1871-1877. Each of the other heater units 281-286 includes one heater (e.g., the heater unit 281 includes a heater 1811). In other embodiments, each of the M heater units includes more than N heaters. Here, the minimum number of the heater is equal to (2N−1). In the illustrated example, the number of the superconducting coils is N=7, thus the minimum number of the heaters is equal to 2*7−1=13.

Figure 3:
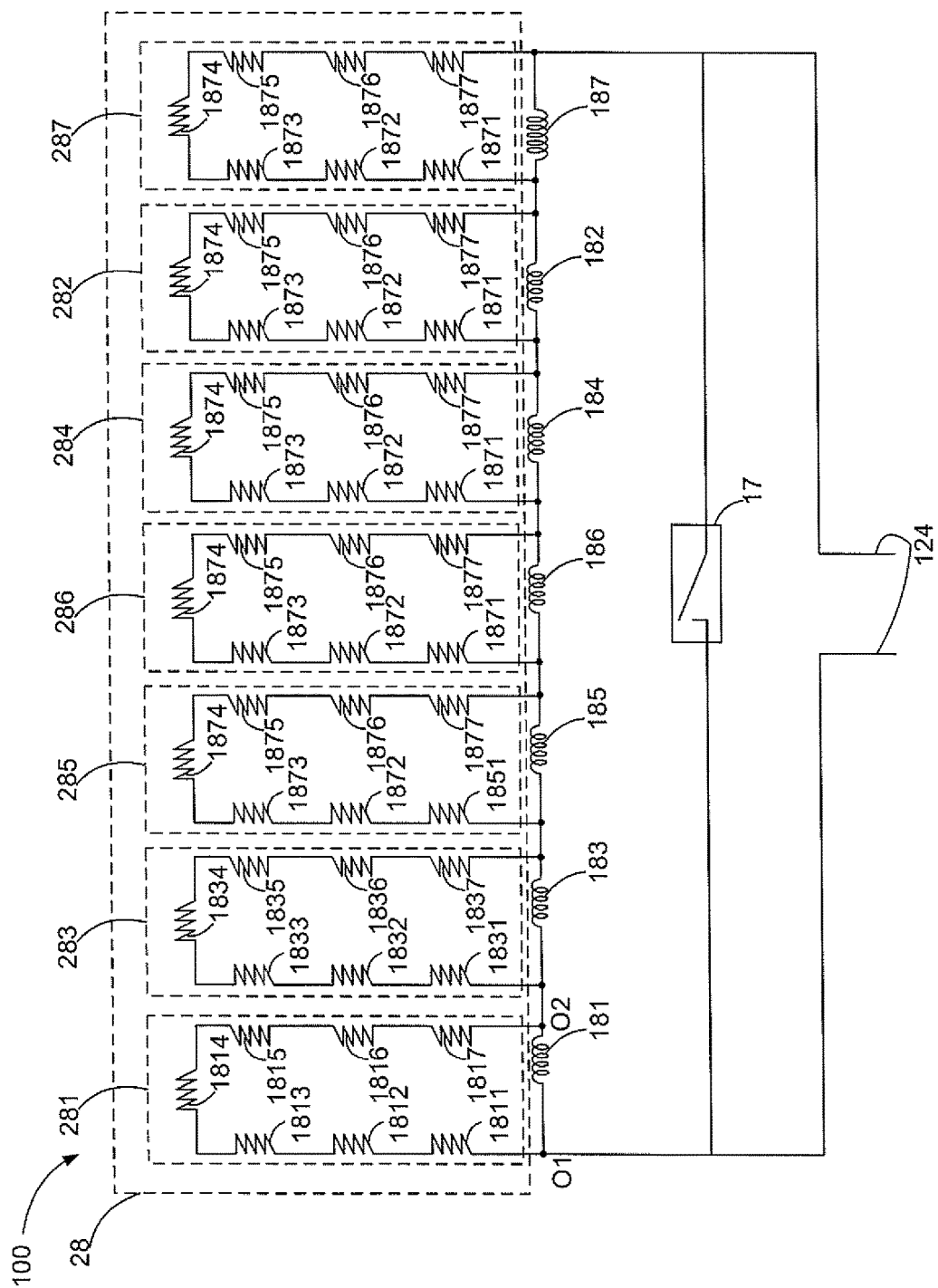
FIG. 3 is a circuit schematic diagram related to the heater matrix module thermally coupled with the multiple superconducting coils of the quench protection apparatus of the superconducting magnet system of FIG. 1 according to one embodiment.

Referring to FIG. 2 and FIG. 3 together, each of the heaters 1811-1861 of the heater units 281-286 is electrically coupled in parallel with the superconducting coils 181-186 respectively. In addition, each of the heaters 1811-1861 is thermally coupled with the bucking superconducting coil 187 as shown in FIG. 3.

Each of the heaters 1871-1877 is electrically coupled in parallel with the bucking superconducting coil 187. In addition, each of the heaters 1871-1877 is thermally coupled with a separate one of the superconducting coils 181-187 as shown in FIG. 3.

As an example, the width of each of heaters 1811-1861 and 1871-1877 is equal to or close to the width of the corresponding superconducting coils 181-187. Therefore, these heaters can provide a quick heating response to the superconducting coils 181-187 once these heaters are triggered. In other embodiments, the width of the heaters 1811-1861 and 1871-1877 can be adjusted according to other design criteria, such as based on some specific structure design requirements for example.

As an example, the heaters 1811-1871 are evenly disposed on the bucking superconducting coil 187, which can achieve equal responses to the heaters 1811-1871. In other embodiments, the position arrangement of the heaters 1811-1871 can be adjusted according to requirements.

The quench protection apparatus 100 can provide a reliable, fast-response quench protection with lower actuation energy. Further, the quench protection apparatus 100 does not involve any additional quench-detection signals and energy dump resistors, which can simplify the quench protection apparatus and reduce costs as well.

In a normal operating mode, the current will only flow in the superconducting loop consisting of the superconducting coil 181-187 and the main superconducting switch 17. It is understood that, in a normal superconducting mode, no current will flow through the heaters and no heat will be generated. For ease of explanation, assume a quench starts in a local area of a coil, for example in the medium superconducting coil 183. This initial quench will build up a voltage across the superconducting coil 183, and thus a voltage will be coupled in the corresponding heater 1831. Then, the heater 1831 will be triggered to heat up its thermally attached superconducting coil 187. Because the heater 1831 is additionally thermally coupled with the bucking superconducting coil 187, the bucking superconducting coil 187 will quench immediately.

During a magnet charging (ramping up) or discharging (ramping down) process, since the ramp voltage is very small in each superconducting coil, the current through each heater is very small. The heater matrix module 28 is designed so that the small amount of heat from the heaters will not trigger any unintentional ramp quench. However, if a superconducting coil quenches during a ramp, the quench protection apparatus will protect the superconducting coils in the similar way as when the superconducting coils are operated in a persistent mode.

After the bucking superconducting coil 187 quenched, a large voltage in the bucking coil 187 will be built up rapidly. Then, the corresponding electrically parallel coupled heaters 1871-1877 are all triggered by the voltage across the bucking superconducting coil 187. Because those heaters 1871-1877 are additionally thermally coupled with the superconducting coils 181-187, those non-quenched main superconducting coils 181, 182, 184-186 will quench subsequently as well. And the other heaters 1811, 1821, 1841-1861 are also triggered by the corresponding voltage, to further accelerate the quench propagation. Therefore, all of the superconducting coils 181-187 will quench in a very short time, such as less than two seconds typically, which can effectively prevent the superconducting coils 181-187 from damage during the quench.

In the illustrated embodiments of FIG. 2 and FIG. 3, the heaters 1811-1871 are thermally coupled with the bucking superconducting coil 187 due to the width and ampere-turns of the bucking superconducting coil 187 are the largest in all of the superconducting coils. In most instances, the quench voltage across the bucking superconducting coil 187 is higher than the quench voltage across each of the main superconducting coils 181-186 due to the higher inductance of the bucking superconducting coil 187 caused by the bucking superconducting coil 187 is radially the largest one in the all superconducting coils 181-187 typically. Therefore, this can speed up the total quench process and spread out the energy dissipation quickly, which can protect all the superconducting coils 181-187 properly.

In addition, because the diameter, width and ampere-turns of the bucking superconducting coil 187 are the largest, the bucking superconducting coil 187 has the largest inductance and thermal mass among the whole coils, thus the bucking superconducting coil 187 may be the one coil which mostly needs to be quenched first when a quench occurs, to help dissipate the energy of the system rapidly. In other words, if the bucking superconducting coil 187 quenches at the earliest and quickest, the quench damage risk will intrinsically be reduced, to prevent an over-temperature state by dumping energy into the largest coil mass. Therefore, the heaters 1811-1871 are thermally coupled with the bucking superconducting coil 187 as a preferable embodiment.

Figure 4:
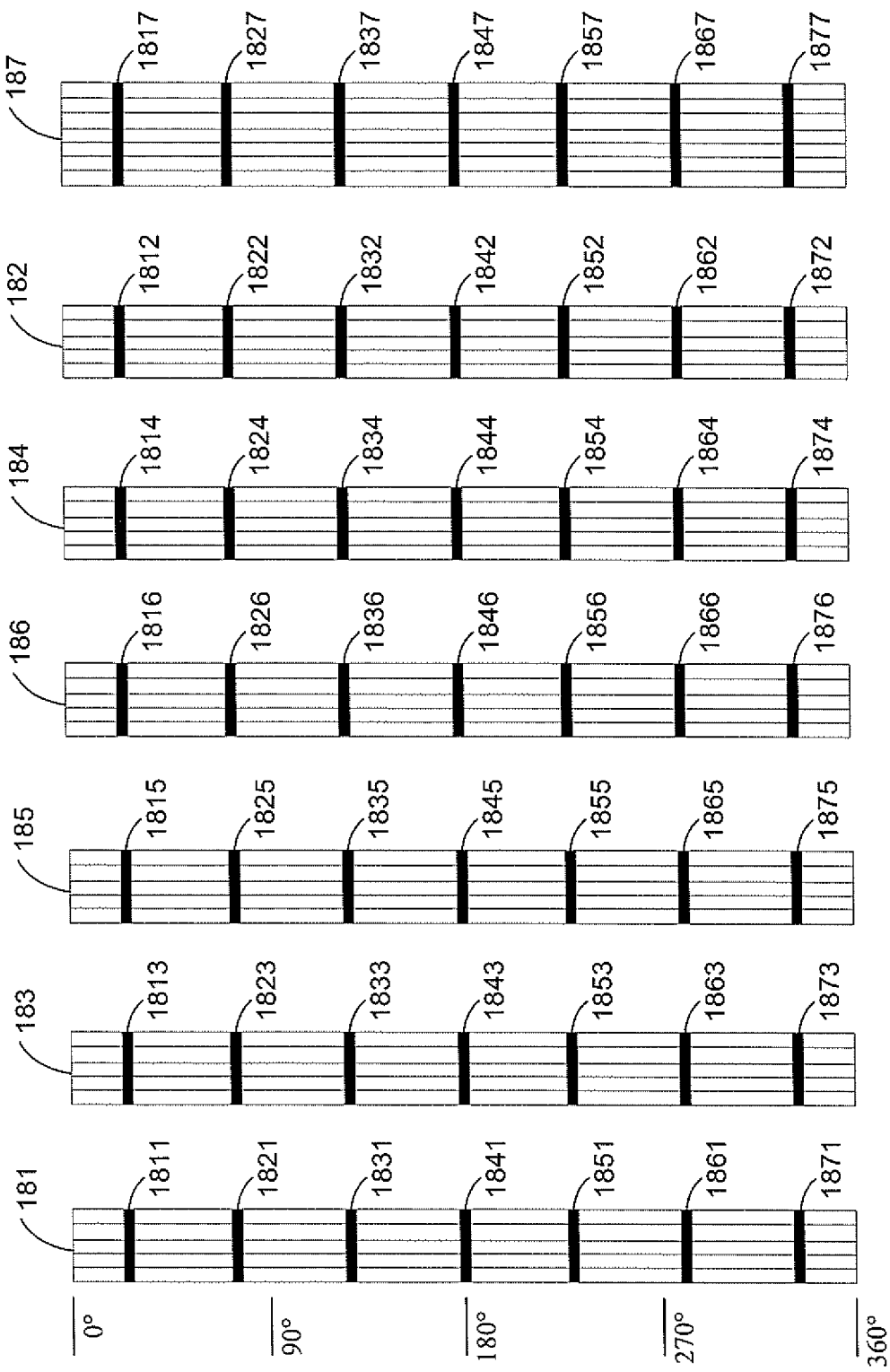
FIG. 4 is a schematic cross-sectional view taken along a vertical center plane of a superconducting magnet system according to another embodiment.
Figure 5:
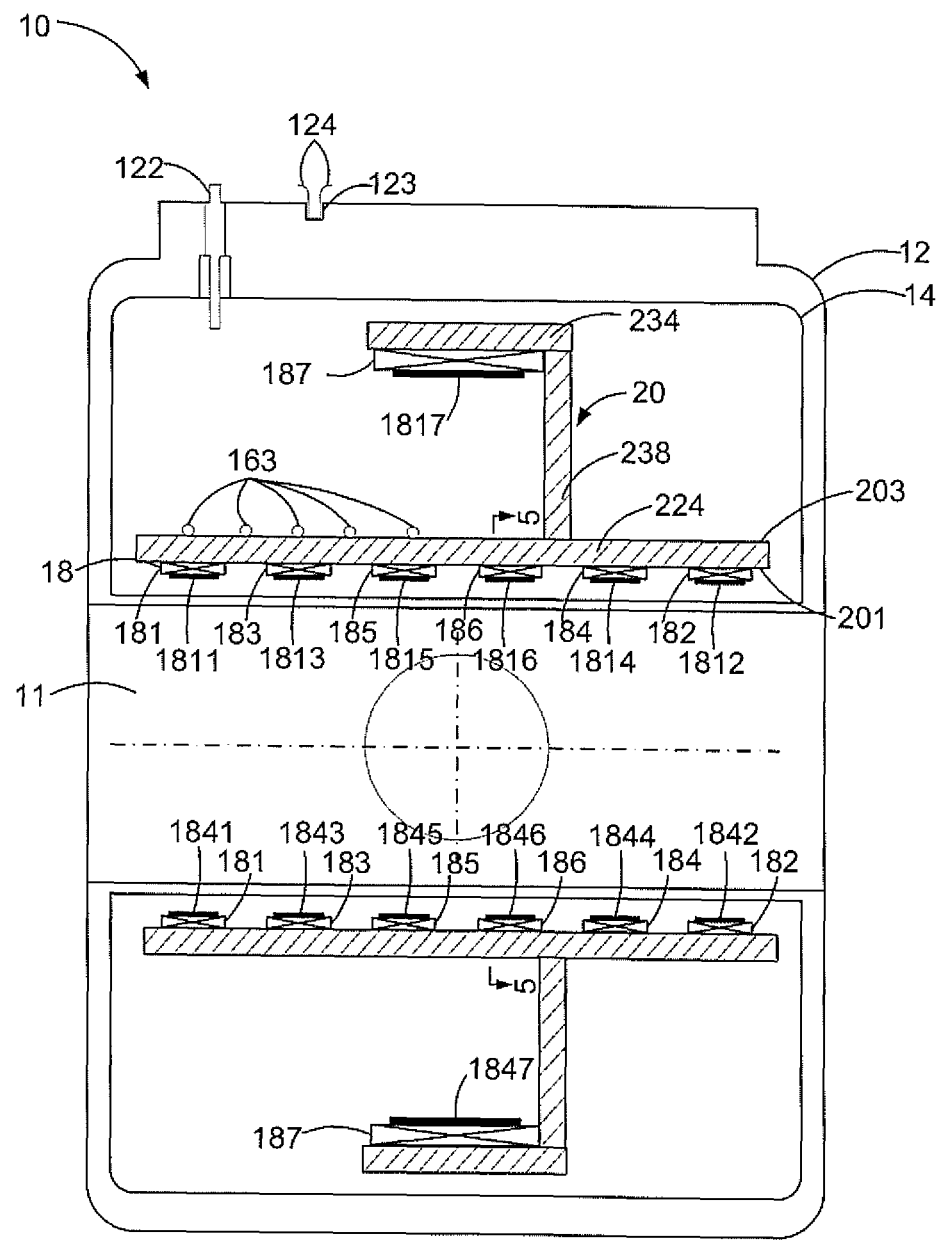
FIG. 5 is a circuit schematic diagram related to a heater matrix module electrically coupled with multiple superconducting coils of a quench protection apparatus of the superconducting magnet system of FIG. 4 according to one embodiment.
Figure 6:
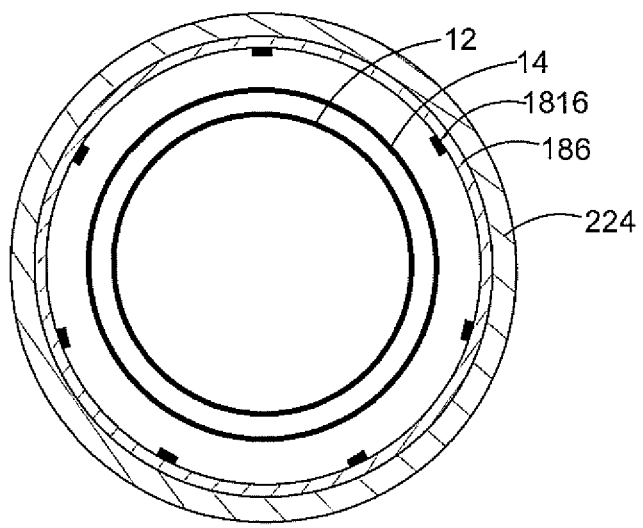
FIG. 6 is a circuit schematic diagram related to the heater matrix module thermally coupled with the multiple superconducting coils of the quench protection apparatus of the superconducting magnet system of FIG. 4 according to one embodiment.

In other embodiments, the M heater unit which includes at least N heaters also can be thermally coupled with any one of the main superconducting coils 181-186. FIGS. 4-5-6 describe another embodiment of the superconducting magnet system 10. In this embodiment, the M heater unit which includes at least N heaters is disposed thermally in contact with the main superconducting coil 182 as an example.

In the quench protection apparatus 100 of FIG. 5, the main superconducting coils 181-186 and the bucking superconducting coil 187 are electrically coupled in series and then connected between the power leads 124. The bucking superconducting coil 187 carries current in an opposite direction to the main superconducting coils 181-186. The main superconducting switch 17 is electrically coupled between the power leads 124 as well.

Referring to FIG. 5 and FIG. 6 together, the heater unit 282 which includes the heaters 1821-1827 is electrically coupled in parallel with the main superconducting coil 182. In addition, each of the heaters 1821-1827 is thermally coupled with a separate one of the superconducting coils 181-187. The other heater units 281 and 283-287 each includes a heater 1811 and 1831-1871. In addition, each of the heaters 1811 and 1831-1871 is thermally coupled with the main superconducting coil 182.

Similar to the quench protection apparatus 100 of FIG. 2, the quench protection apparatus 100 of FIG. 5 also can provide a reliable, fast-response quench protection with lower actuation energy based on the similar quench protection process as described above, and thus not described again.

As mentioned above, the magnetic shield of the superconducting magnet system 10 also can be generated by other types of configurations without using the bucking superconducting coil 187. If the bucking superconducting coil 187 is not included in the superconducting magnet system 10, one of the main superconducting coils 181-186 may act as a quench trigger coil as the bucking superconducting coil 187 of FIG. 2 or the main superconducting coil 182 of FIG. 5.

In some embodiments, the bucking superconducting coil 187 is not used. The quench protection apparatus has a similar configuration as the quench protection apparatus 100 of FIG. 2 and FIG. 3, and thus not described in detail.

Figure 7:
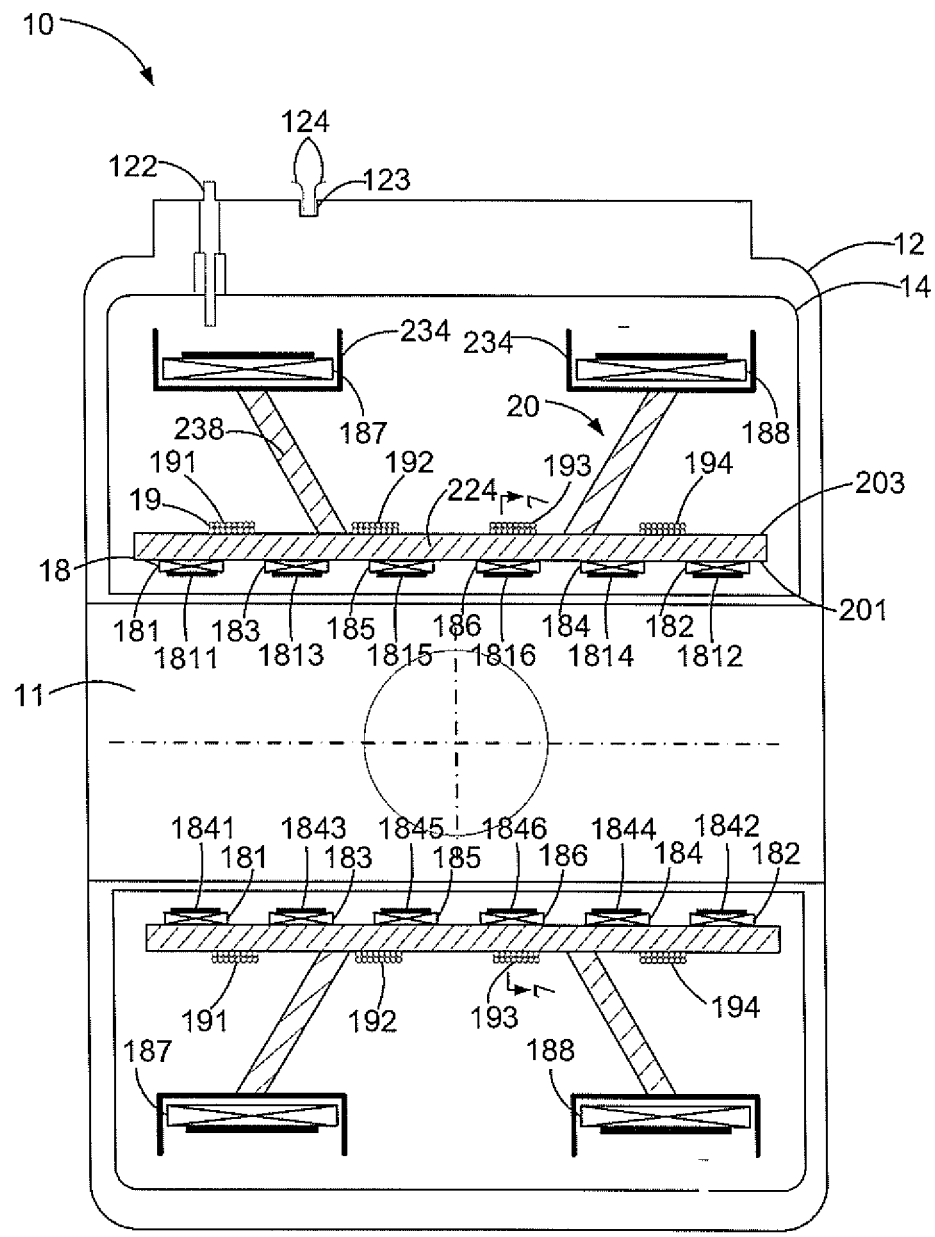
FIG. 7 is a circuit schematic diagram related to a heater matrix module electrically coupled with multiple superconducting coils of a quench protection apparatus of the superconducting magnet system of FIG. 1 according to another embodiment.
Figure 8:
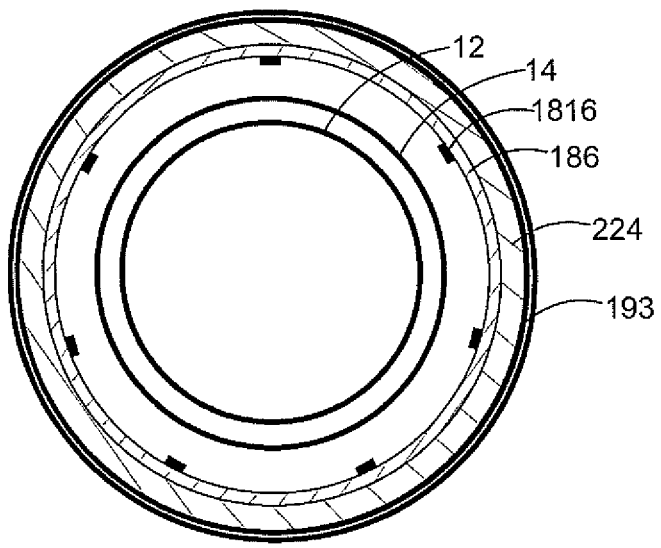
FIG. 8 is a circuit schematic diagram related to a heater matrix module electrically coupled with multiple superconducting coils of a quench protection apparatus of the superconducting magnet system of FIG. 1 according to yet another embodiment.

Referring to FIG. 7 and FIG. 8, a circuit schematic diagram related to a quench protection apparatus 100 according to another two embodiments are shown respectively. Compared with the quench protection apparatus 100 of FIG. 2, the quench protection apparatus 100 of FIG. 7 and FIG. 8 only changes the electrically connection between the number M of heater units (e.g., the heater unit 287) that includes at least N heaters and the corresponding superconducting coil 187. In general, the heater unit 287 is electrically coupled across a section of the bucking superconducting coil 187, but not the whole bucking superconducting coil 187 as mentioned above.

In the illustrated embodiment of FIG. 7, the heater unit 287 is electrically coupled between a medium or interim point 'P1' and a terminal 'B' of the bucking superconducting coil 187. In some embodiments, the section P1-B of the bucking superconducting coil 187 is mainly related to a resistive response section, and the other section A-P1 of the bucking superconducting coil 187 is mainly related to an inductive response section. Here, the term "resistive response section" represents a section of the bucking superconducting coil 187 where the voltage difference is mostly positively increased once the coil 187 quenches, and the term "inductive response section" represents a section of the bucking superconducting coil 187 where the voltage difference is mostly negatively increased once the bucking superconducting coil 187 quenches.

Because the heater unit 287 is electrically coupled between two points of the resistive response section, such as the section P1-B, the voltage difference is mostly positively increased without the negative influence from the inductive response section, the heaters thermally attached to the bucking coil 187 may be triggered faster than that in the quench protection apparatus 100 of FIG. 2. Therefore, the quench propagation velocity will be further increased. In some embodiments, the medium terminal 'B' of the bucking superconducting coil 187 is the terminal on the inner surface thereof, and the heaters 1811-1861 of the other heater units 281-286 are thermally attached to the inner surface of the bucking superconducting coil 187. The selection of the medium point 'P1' may be determined based on simulation analysis. In other embodiments, the voltage difference response section may be selected in other sections of the bucking superconducting coil 187. For example, the section is between two medium points 'P1' and 'P2' of the coil 187 as shown in FIG. 8. Correspondingly, the heaters 1811-1861 also can be thermally attached to the other positions of the bucking superconducting coil 187, such as on the external surface of the bucking superconducting coil 187.

Referring to FIG. 9, a circuit schematic diagram related to a quench protection apparatus 100 according to yet another embodiment is shown. In some specific embodiments, some individual coils may be easily damaged during a quench than others, and thus those coils need to be protected carefully. For ease of explanation, in this exemplary embodiment of FIG. 9, the two main superconducting coils 185 and 186 may be those coils which need to be protected carefully.

Referring to FIG. 9 and FIG. 10, for protecting the main superconducting coils 185 and 186 better, two additional heaters 1832 and 1842 are further added based on the quench protection apparatus 100 of FIG. 2. In some embodiments, the additional heaters 1832 and 1842 are respectively electrically coupled to the main superconducting coils 183 and 184 in parallel. In addition, the additional heaters 1832 and 1842 are respectively thermally coupled the main superconducting coils 185 and 186 shown in FIG. 10 as an example. In some embodiments, the additional heaters 1832 and 1842 may be respectively electrically coupled to other two superconducting coils in parallel. In this embodiment, the heaters 1832 and 1874 are evenly arranged on the superconducting coil 185, and the heaters 1842 and 1875 are evenly arranged on the superconducting coil 186.

When a quench starts in the superconducting coil 183 (or the coil 184), the previous mentioned quench protection apparatus 100 of FIG. 2 will be triggered and quench all of the coils which have been described in detail and not described again here. Meanwhile, the additional heater 1832 (or the heater 1842) will provide an additional quench protection to the superconducting coil 185 (or and superconducting coil 186). In other words, during the quench propagation, the superconducting coil 185 (or and superconducting coil 186) will be quenched by the heaters 1832 and 1874 (or the heaters 1842 and 1875) together, not just only by the heater 1874 (or the heater 1875), which can further increase quench protection efficiency.

The exemplary embodiment of FIG. 9 and FIG. 10 only shows a simple example to explain the utility of the additional heaters 1832 and 1842. In certain embodiments, the number and the position of the additional heaters can be adjusted according to different design criteria.

Referring to FIG. 11, a schematic cross-sectional view taken along a vertical center plane of a superconducting magnet system 10 according to another embodiment is shown. As shown in FIG. 11, the main superconducting coils 181-186 are same in size. In this embodiment, each heater unit includes the number N of heaters (e.g., the heater unit 281 includes heaters 1811, 1812, 1813, 1814, 1815, 1816 and 1817). In the embodiment of FIG. 12, the number N of heaters are electrically coupled in parallel in one heater unit and then coupled to a corresponding superconducting coil in parallel. In the embodiment of FIG. 13, the number N of heaters are electrically coupled in series in one heater unit and then coupled to a corresponding superconducting coil in parallel. In some embodiments, the number N of heaters are coupled in series in at least one heater unit and then coupled to corresponding superconducting coil in parallel. The number N of heaters are coupled in parallel in the other heater units and then coupled to corresponding superconducting coil in parallel. In other embodiments, for each heater unit, some of the number N of heaters are electrically coupled in series with two terminals of a corresponding superconducting coil. The others of the number N of heaters are electrically coupled in parallel with the two terminals of the corresponding superconducting coil.

In the illustrated embodiments of FIG. 12 and FIG. 13, the heater matrix module 28 is an N*N matrix which includes heaters 1811-1817, 1821-1827, 1831-1837, 1841-1847, 1851-1857, 1861-1867, and 1871-1877. More specifically, the number N is equal to 7 and the number of the heaters of the heater matrix module 28 is equal to 7*7=49 in this embodiment. In another embodiment, the number of heaters of at least one of the heater units 281-287 may be more than N.

Referring to FIG. 14, a schematic view related to the heater matrix module thermally mounted on the number N of superconducting coils of a quench protection apparatus 100 of the superconducting magnet system 10 of FIG. 12 or FIG. 13 according to one embodiment is shown. Each superconducting coil is thermally coupled with at least one of the heaters of each heater unit. As an example, the heater 1811 of the heater unit 281, the heater 1821 of the heater unit 282, the heater 1831 of the heater unit 283, the heater 1841 of the heater unit 284, the heater 1851 of the heater unit 285, the heater 1861 of the heater unit 286, and the heater 1871 of the heater unit 287 are thermally coupled with the main superconducting coil 181 as shown in FIG. 14. In another embodiment, one or more heaters in a heater unit can be thermally coupled with a superconducting coil when the corresponding heater unit includes more than N heaters.

In a normal operating mode, the current only flows in the superconducting loop consisting of the number N of superconducting coils 181-187 and the main superconducting switch 17. It is understood that, in a normal superconducting mode, the current doesn't flow through the heaters and heat is not generated. During a magnet charging (ramping up) or discharging (ramping down) process, since the ramp voltage is very small in each coil, the current through each heater is very small. The circuit is designed so that the small amount of heat from the heaters will not trigger any unintentional ramp quench.

Combining FIG. 12 and FIG. 14 together for simplicity of illustration, assume that a quench starts in a local area of a superconducting coil, for example in the superconducting coil 181. This initial quench builds up a voltage across the superconducting coil 181 and the heater unit 281. The heaters 1811-1817 in the heater unit 281 are heated up and the corresponding superconducting coils 181-187 thermally attached thereto are heated up then. Since the heater 1811 is thermally coupled with the main superconducting coil 181, the quench at the main superconducting coil 181 is speeded up to quench. The heaters 1812-1817 are thermally coupled with the superconducting coils 182-187 respectively, therefore, those superconducting coils 182-187 quench subsequently as well.

Since all those superconducting coils 182-187 have quenched, a voltage is built up across each superconducting coil 182-187 and the corresponding heater units 282-287. The heaters 1821-1827, 1831-1837, 1841-1847, 1851-1857, 1861-1867, 1871-1877 are heated up and the corresponding superconducting coils 182-187 thermally attached thereto are heated up then. Eventually, the quenches at all those superconducting coils 181-187 are speeded up to quench by the use of the cross-linked heater matrix module 28.

The heater matrix module 28 triggers all superconducting coils to quench in one single step when any superconducting coil starts to quench. The cross-linked heater matrix module 28 induces all other superconducting coils to quench simultaneously, which effectively shortens the quench protection reaction time, and prevent the superconducting coils 181-187 from damage during the quench.

As an example, the width of each heater of the heater matrix module 28 is equal to or close to the width of the corresponding superconducting coils 181-187. That means each heater is thermally coupled with every turn of the superconducting coil and these heaters can provide a quick heating response to the superconducting coils 181-187 once these heaters are triggered. Eventually, the quench is speeded up. More specifically, this enables the energy in the magnet to quickly spread out among all superconducting coils including the initial superconducting coil, so as to avoid the over temperature or over voltage damage to the initial superconducting coil during the quench. In other embodiments, the width of the heaters can be adjusted according to other design criteria, such as based on some specific structure design requirements or the heater leads assembly requirements.

As an example, the attached heaters (e.g., the heaters 1811, 1821, 1831, 1841, 1851, 1861, 1871) on each superconducting coil (e.g., the superconducting coil 181) are evenly disposed, which can achieve equal responses to the attached heaters. In other embodiments, the position arrangement of the attached heaters on each superconducting coil can be adjusted according to different design requirements.

The quench protection apparatus 100 can provide a reliable, fast-response quench protection with lower actuation energy. Further, the quench protection apparatus 100 does not involve any additional quench-detection signals and energy dump resistors, which can simplify the quench protection apparatus and reduce costs as well.

Referring to FIG. 15, a schematic cross-sectional view taken along a vertical center plane of a superconducting magnet system according to another embodiment is shown. Compared with the illustrated embodiment of FIG. 11, the thermo-siphon cooling pipes 163 and other cooling assemblies (e.g., a liquid cryogen storage) are used as the cooling apparatus. A metal former 20 (also called coil support structure) is further provided. The metal former 20 is also electromagnetically coupled with the number N of superconducting coils. The metal former 20 includes a main coil former 224, a bucking coil former 234 and a supporting member 238. The bucking coil former 234 is connected to the main coil former 224 via the supporting member 238. The main coil former 224 is configured to support the main superconducting coil 181-186. The bucking coil former 234 is configured to support the bucking superconducting coil 187. In this embodiment as shown in FIG. 15, a single bucking superconducting coil 187 is shown. In another embodiment of FIG. 17, a pair of bucking superconducting coils 187 and 188 is employed. In other embodiments, more than two bucking superconducting coils can be employed.

The superconducting coils 181-187 are physically in contact with an inner surface 201 of the main coil former 224. In other embodiments, the superconducting coils 181-187 can be physically in contact with an outer surface 203 of the main coil former 224. In the illustrated embodiment, each heater of the heater matrix module 28 is thermally coupled with a corresponding superconducting coil. More specifically, each heater is installed on a surface of the corresponding superconducting coil. In some embodiments, some slots can be further defined on the inner surface or the outer surface of the metal former 20 to accommodate the number N of superconducting coils 181-187. There may be a gap between the metal former 20 and the bottom wall of the thermal shield 14. FIG. 16 shows a schematic cross-sectional view taken along a line 5-5 of the main metal former 224 and the superconducting coils 18 having the heaters (e.g., the heater 1816) of FIG. 11.

The metal former 20 is made of high electrically conductive materials, for example, aluminum or aluminum alloy (such as aluminum alloy 1100), copper, etc. In other embodiments, the metal former 20 can be made from other types of electrically conductive materials with high mechanical strength, such as aluminum alloy LM31 or A356, etc.

During a quench, the heater matrix module 28 is triggered to heat the number N of superconducting coils 18 to prevent the quenched superconducting coil from damage. Since the metal former 20 is electromagnetically coupled with the number N of superconducting coils 18, the magnetic field flux linked with the metal former 20 is changed, and the electrically conductive metal former 20 induces eddy current therein, which can shunt current from the quenched superconducting coil and share the load of joule heating at the quench initial hot spot of the quenched superconducting coil.

Accordingly, in addition to providing a supporting function, the conductive metal former 20 can further reduce the peak temperature inside the number N of superconducting coils 18 during the quench.

Referring to FIG. 17, a schematic cross-sectional view taken along a vertical center plane of a superconducting magnet system according to another embodiment is shown. Compared with the illustrated embodiment of FIG. 15, the superconducting magnet system 10 in FIG. 17 further includes multiple electrically conductive windings 19. The electrically conductive windings 19 include electrically conductive windings 191, 192, 193, 194. In another embodiment, the number of the electrically conductive windings 19 can be adjusted according to different design requirements. The electrically conductive windings 19 include copper or high purity aluminum. Each of the electrically conductive windings 191-194 is electromagnetically coupled with the number N of superconducting coils 181-188. Each electrically conductive winding is electrically shorted. In this embodiment, the electrically conductive windings 19 are physically in contact with the outer surface 203 of the main coil former 224. In other embodiments, the electrically conductive windings 19 can be physically in contact with the inner surface 201 of the main coil former 224. FIG. 18 shows a schematic cross-sectional view taken along a line 7-7 of the main metal former 224 and the superconducting coils 186 having the heaters (e.g., the heater 1816) of FIG. 11. In other embodiments, each of the electrical conductive windings can be made of solid ring or cylinder with electrically conductive materials, such as copper or high purity aluminum.

From one side, the metal former 20 supports the electrically conductive windings 19 and the number N of superconducting coils 18 as the coil support structure to make sure that the construction is steady. From another side, during a quench, the heater matrix module 28 is triggered to heat the number N of superconducting coils 18 to prevent the quenched superconducting coil from damage. Since the electrically conductive windings 19 are electromagnetically coupled with the number N of superconducting coils 181-187, the magnetic field flux linked with the electrically conductive windings 19 is changed, and the electrically conductive windings 19 induce eddy current therein, which can shunt current from the quenched superconducting coil 18 and share the load of joule heating at the quench initial hot spot of the quenched superconducting coils 18. Furthermore, since the electrically conductive windings 19 are physically in contact with the metal former 20, the metal former 20 can further help dissipate the energy in the electrically conductive windings 19 during the quench process.

Besides the heater matrix module 28 for protecting the superconducting coils, electrically conductive metal former 20 and/or electrically conductive windings 19 are supplemented for generating eddy current to further protect the superconducting coils. Since the quench protection needs to take full effect in around 1 second or so, incorporating the heater matrix module 28 plus eddy current effect is particularly very useful and necessary to protect magnet with epoxy resin impregnated superconducting coils and thermo-siphon and/or conduction cooling.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

It is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

What is claimed is:

1. A quench protection apparatus comprising:
    a plurality of main superconducting coils;
    a bucking superconducting coil;
    a plurality of main heater units each being electrically coupled in parallel with a corresponding main superconducting coil, each main heater unit comprising a plurality of heaters; and
    a bucking heater unit being electrically coupled in parallel with the bucking superconducting coil, the bucking heater unit comprising a plurality of heaters;
    wherein at least one heater of each main heater unit is thermally coupled with the bucking superconducting coil, and
    wherein each main superconducting coil is thermally coupled with a corresponding heater of the bucking heater unit.

2. The quench protection apparatus of claim 1, wherein the plurality of main superconducting coils comprise a pair of large superconducting coils, a pair of medium superconducting coils, and a pair of small superconducting coils.

3. The quench protection apparatus of claim 1, wherein the plurality of main superconducting coils are configured to generate a main magnetic field, and the bucking superconducting coil is configured to generate a magnetic shield to prevent the main magnetic field from going beyond a designated area.

4. The quench protection apparatus of claim 1, wherein the plurality of main superconducting coils and the bucking superconducting coil are electrically coupled in series.

5. The quench protection apparatus of claim 1, wherein the bucking superconducting coil carries current in an opposite direction to the plurality of main superconducting coils.

6. A superconducting magnet system comprising:
    a cryogen vessel containing cryogen;
    a plurality of main superconducting coils located at a center inner surface of the cryogen vessel;
    a bucking superconducting coil located at a periphery inner surface of the cryogen vessel;
    a plurality of main heater units each being electrically coupled in parallel with a corresponding main superconducting coil, each main heater unit comprising a plurality of heaters; and
    a bucking heater unit being electrically coupled in parallel with the bucking superconducting coil, the bucking heater unit comprising a plurality of heaters;
    wherein at least one heater of each main heater unit is thermally coupled with the bucking superconducting coil, and
    wherein each main superconducting coil is thermally coupled with a corresponding heater of the bucking heater unit.

7. The superconducting magnet system of claim 6, wherein the plurality of main superconducting coils and the bucking superconducting coil are cooled by the cryogen in the cryogen vessel.

8. The superconducting magnet system of claim 6, wherein the cryogen is liquid helium.

9. The superconducting magnet system of claim 6, further comprising a thermal shield enclosing the cryogen vessel.

10. The superconducting magnet system of claim 6, wherein the plurality of main superconducting coils comprise a pair of large superconducting coils located at two axially outer sides of the center inner surface, a pair of small superconducting coils located at the center of the center inner surface, and a pair of medium superconducting coils located axially between the large and small superconducting coils.

11. The superconducting magnet system of claim 6, wherein the plurality of main superconducting coils are configured to generate a main magnetic field, and the bucking superconducting coil is configured to generate a magnetic shield to prevent the main magnetic field from going beyond a designated area.

* * * * *